(12) United States Patent
Chen et al.

(10) Patent No.: US 11,910,538 B2
(45) Date of Patent: Feb. 20, 2024

(54) ELECTRONIC DEVICE HOUSINGS WITH PATTERNED ELECTROLYTIC PLATING LAYERS

(71) Applicant: Hewlett-Packard Development Company, L.P., Spring, TX (US)

(72) Inventors: Yi-Chen Chen, Taipei (TW); Kun Cheng Tsai, Taipei (TW); Kuan-Ting Wu, Taipei (TW); Ying-Hung Ku, Taipei (TW); Hsueh Chen Hung, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 46 days.

(21) Appl. No.: 17/602,884

(22) PCT Filed: Aug. 8, 2019

(86) PCT No.: PCT/US2019/045593
§ 371 (c)(1),
(2) Date: Oct. 11, 2021

(87) PCT Pub. No.: WO2021/025695
PCT Pub. Date: Feb. 11, 2021

(65) Prior Publication Data
US 2022/0167505 A1    May 26, 2022

(51) Int. Cl.
*H05K 3/18*    (2006.01)
*H05K 1/09*    (2006.01)
(Continued)

(52) U.S. Cl.
CPC .............. *H05K 3/181* (2013.01); *H05K 1/09* (2013.01); *H05K 1/117* (2013.01); *H05K 3/027* (2013.01);
(Continued)

(58) Field of Classification Search
CPC .......... H05K 1/056; H05K 1/09; H05K 1/092; H05K 1/028; H05K 1/0195; H05K 1/0271;
(Continued)

(56) References Cited

U.S. PATENT DOCUMENTS 5,220,491 A * 6/1993 Sugano ............... H01L 23/5385
361/791
6,399,898 B1    6/2002 Kwong et al.
(Continued)

FOREIGN PATENT DOCUMENTS

CN    105280575 A    1/2016
DE    102011054105 A1    4/2013
(Continued)

OTHER PUBLICATIONS

JP 2004/363553 A (Translation) (Year: 2023).*
JP 2016/051834 A (Translation) (Year: 2023).*
WellPCB: Photolithography Technology (Year: 2007).*

*Primary Examiner* — Hoa C Nguyen
*Assistant Examiner* — John B Freal
(74) *Attorney, Agent, or Firm* — HP Inc. Patent Department

(57) ABSTRACT

In one example, an electronic device housing may include a substrate, an insulating adhesive layer formed on a surface of the substrate, a patterned electroless plating layer formed on the insulating adhesive layer, and a patterned electrolytic plating layer formed on the patterned electroless plating layer.

11 Claims, 4 Drawing Sheets

(51) Int. Cl.
 *H05K 1/11* (2006.01)
 *H05K 3/02* (2006.01)
 *H05K 3/40* (2006.01)
 *H05K 5/00* (2006.01)

(52) U.S. Cl.
 CPC ............. *H05K 3/188* (2013.01); *H05K 3/403* (2013.01); *H05K 5/0026* (2013.01); *H05K 2203/0502* (2013.01)

(58) Field of Classification Search
 CPC .... H05K 1/0277; H05K 1/0281; H05K 1/118; H05K 1/11; H05K 2201/0141; H05K 2201/0145; H05K 2201/0329; H05K 2201/0195; H05K 2201/0332; H05K 2201/0364; H05K 2201/0379; H05K 2201/09218; H05K 2201/098; H05K 2201/09672; H05K 2201/09709; H05K 2201/09763; H05K 2201/0133; H05K 2201/05; H05K 2201/09236; H05K 2201/0317; H05K 1/14; H05K 1/141; H05K 1/42; H05K 1/148
 See application file for complete search history.

(56) References Cited

U.S. PATENT DOCUMENTS

2004/0040856 A1\* 3/2004 Hamano ................ C25D 5/022
 205/187
2007/0218676 A1 9/2007 Wang et al.

FOREIGN PATENT DOCUMENTS

| | | | |
|---|---|---|---|
| JP | 2004363553 A | \* | 12/2004 |
| JP | 2016051834 A | \* | 4/2016 ....... H01L 23/49822 |
| JP | 2019029518 A | | 2/2019 |
| KR | 20100066821 A | | 6/2010 |
| NZ | 328436 A | | 6/1998 |

\* cited by examiner

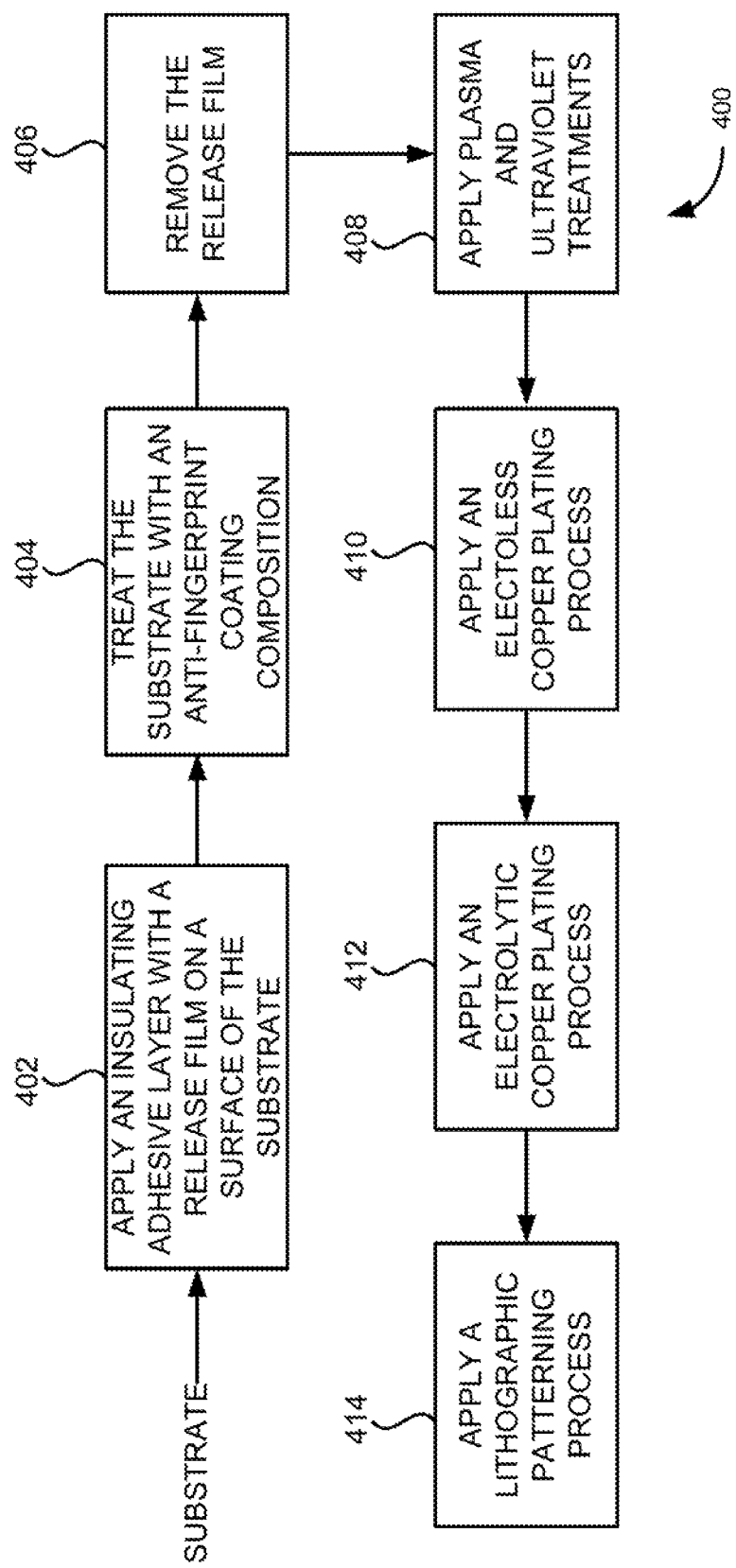

ELECTRONIC DEVICE HOUSINGS WITH PATTERNED ELECTROLYTIC PLATING LAYERS

BACKGROUND

In recent years, housings with lightweight and high rigidity properties have become popular since the portable electronic products are developed to be lighter and smaller. Electronic devices may utilize multiple components to perform various functions. The components of an electronic device may be arranged on a printed circuit board (PCB), such as a motherboard of the electronic device. Further, the motherboard may be attached to a chassis and also connected to other internal components (e.g., daughterboards) via cables or internal connectors, such as flexible printed circuits (FPCs) or flexible flat cables (FFCs).

BRIEF DESCRIPTION OF THE DRAWINGS

Examples are described in the following detailed description and in reference to the drawings, in which:

FIG. 4 illustrates another example flowchart for manufacturing a casing of an electronic device.

DETAILED DESCRIPTION

Figure 1A:
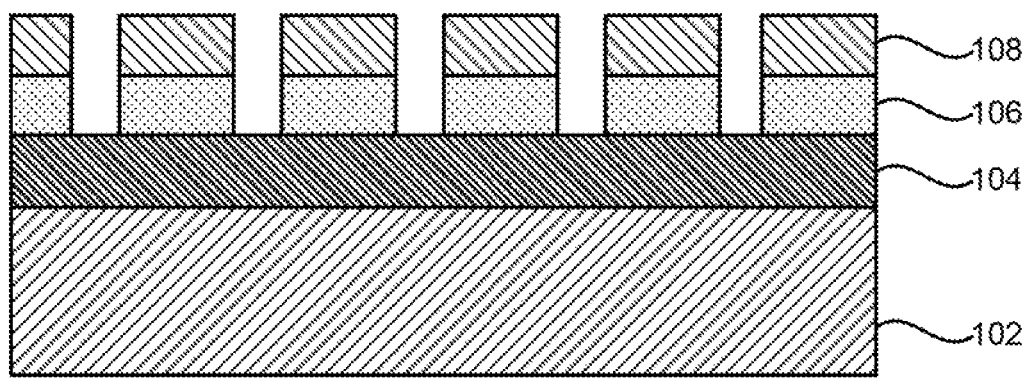
FIG. 1A illustrates a cross-sectional side view of an example electronic device housing, depicting a patterned electroless plating layer and a patterned electrolytic plating layer.

With a trend of miniaturization and multifunctionality of electronic devices, electronic device housings may include multiple components to perform various functions. Example electronic devices may be mobile phones, laptop computers, music players, personal digital assistants, global positioning system devices, and the like. Further, the components may be arranged on a printed circuit board (PCB), such as a motherboard of an electronic device housing. The motherboard may be attached to a chassis and also connected to other internal components (e.g., daughterboards).

In some examples, in order to electrically connect two circuit boards, cables or internal connectors such as flexible printed circuits (FPCs), flexible flat cables (FFCs), or the like may be used. However, cables may consume a significant amount of space for cable routing and limit placement of other components. Further, the cables may be routed by following an assembly operation flow during manufacturing, which may limit mechanical design flexibility. Also, vibration of the electronic device may affect the connection of the cables in long term, which may cause field return and may need an extra fix (e.g., like tape or glue), In case of connectors, placement of the connectors on the motherboard and the daughterboard may follow a cable routing design, which can limit motherboard/daughterboard electrical layout flexibility. Further, a thickness (i.e., Z-height) of the electronic device housing (e.g., a display housing, a keyboard housing, or the like) may limit the connector placement and increase the difficulty in designing the electronic device housing.

Examples described herein may provide an electronic device housing with patterned electroconductive layers (i.e., a patterned electroless plating layer and a patterned electrolytic plating layer). The patterned electroconductive layers may be formed on a surface of the electronic device housing and may connect circuit boards of an electronic device. Thus, examples described herein may eliminate cable utilization for signal routing between the circuit boards and thereby minimizing space consumption. In one example, the electronic device housing may include a substrate, an insulating adhesive layer formed on a surface of the substrate, a patterned electroless plating layer formed on the insulating adhesive layer, and a patterned electrolytic plating layer formed on the patterned electroless plating layer.

In the following description, for purposes of explanation, numerous specific details are set forth in order to provide a thorough understanding of the present techniques. It will be apparent, however, to one skilled in the art that the present apparatus, devices and systems may be practiced without these specific details. Reference in the specification to "an example" or similar language means that a particular feature, structure, or characteristic described is included in at least that one example, but not necessarily in other examples.

Turning now to the figures, FIG. 1A illustrates a cross-sectional side view of an example electronic device housing 100, depicting a patterned electroless plating layer 106 and a patterned electrolytic plating layer 108. Example electronic device housing 100 may include a smart phone housing, tablet or notebook personal computer housing, digital camera housing, or the like. Further, electronic device housing 100 may be implemented as a part of a top cover of a display housing, a bottom cover of a keyboard housing, or a combination thereof.

As shown in FIG. 1A, example electronic device housing 100 may include a substrate 102. Example substrate 102 may be a metal substrate, a non-metal substrate, or a combination thereof. Example metal substrate may include aluminum, magnesium, lithium, zinc, titanium, aluminum alloy, magnesium alloy, lithium alloy, zinc alloy, titanium alloy, or any combination thereof. Further, example non-metal substrate may include plastic, carbon-fiber composite, or a combination thereof.

Further, electronic device housing 100 may include an insulating adhesive layer 104 formed on a surface of substrate 102. In one example, insulating adhesive layer 104 may include polyvinyl acetate, acrylic, phenolics, polycarbonate, polyester, polytetrafluoroethylene (PTFE), polyvinylchloride (PVC), polyetherimide (PEI), polyimide or any combination thereof.

As shown in FIG. 1A, electronic device housing 100 may include a patterned electroless plating layer 106 formed on insulating adhesive layer 104. In one example, patterned electroless plating layer 106 may be a patterned electroless copper plating layer. For example, patterned electroless plating layer 106 may be formed using an electroless plating process to form a conductive coating and to impart conductivity.

Further, electronic device housing 100 may include a patterned electrolytic plating layer 108 formed on patterned electroless plating layer 106. In one example, patterned electrolytic plating layer 108 may be a patterned electrolytic copper plating layer. For example, patterned electrolytic plating layer 108 may be formed using an electrolytic plating process to form a layer or multiple layers of metallic coatings. In one example, patterned electroless plating layer 106 and patterned electrolytic plating layer 108 may form a circuit or a wiring layer having a certain pattern.

Figure 1B:
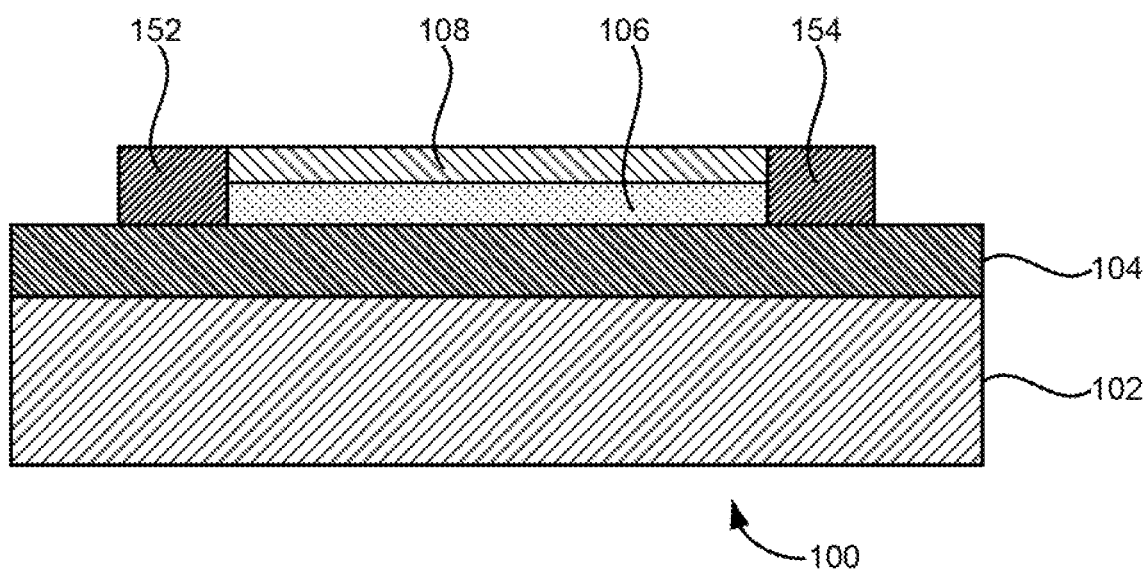
FIG. 1B illustrates a cross-sectional front view of the example electronic device housing of FIG. 1A, depicting additional features.

FIG. 1B illustrates a cross-sectional front view of example electronic device housing 100 of FIG. 1A, depicting additional features. For example, similarly named elements of FIG. 1B may be similar in structure and/or function to elements described with respect to FIG. 1A. As shown in FIG. 1B, electronic device housing 100 may include a first contact pad 152 formed on insulating adhesive layer 104 and connected to a first end of patterned electroless plating layer 106 and patterned electrolytic plating layer 108.

Further, electronic device housing 100 may include a second contact pad 154 formed on insulating adhesive layer 104 and connected to a second end of patterned electroless plating layer 106 and patterned electrolytic plating layer 108. In one example, first contact pad 152 may be electrically connected to second contact pad 154 using patterned electroless plating layer 108 and patterned electrolytic plating layer 108 that forms the circuit or the wiring layer.

Figure 2A:
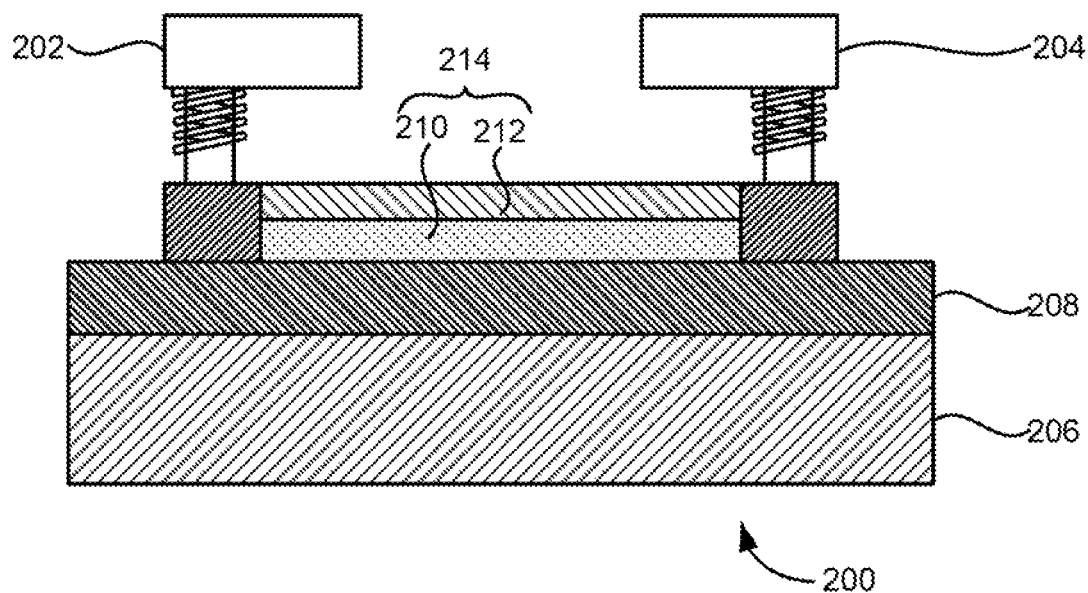
FIG. 2A illustrates a cross-sectional front view of an example electronic device, depicting a patterned electroconductive layer to electrically connect a first circuit board and a second circuit board.

FIG. 2A illustrates a cross-sectional front view of an example electronic device 200, depicting a patterned electroconductive layer 214 to electrically connect a first circuit board 202 and a second circuit board 204. As shown in FIG. 2A, example electronic device 200 may include first circuit board 202, second circuit board 204, and a housing 206 to house first circuit board 202 and second circuit board 204. Example housing 206 may be a display housing, a keyboard housing, or a combination thereof. In one example, the keyboard housing may rotatably, detachably, or twistably connected to the display housing. Example first circuit board 202 may be a motherboard and second circuit board 204 may be a daughterboard. The motherboard may be a PCB containing principal components of electronic device 200, with connectors for other circuit boards. The daughterboard may refer to a circuit board that plugs into and extends the circuitry of another circuit board such as the motherboard or similar expansion cards.

Further, electronic device 200 may include an insulating adhesive layer 208 formed on a surface of housing 206. Furthermore, electronic device 200 may include patterned electroconductive layer 214 formed on insulating adhesive layer 208 to electrically connect first circuit board 202 and second circuit board 204. In one example, patterned electroconductive layer 214 may include a patterned electroless plating layer 210 formed on insulating adhesive layer 208 and a patterned electrolytic plating layer 212 formed on patterned electroless plating layer 210. Example patterned electroless plating layer 210 may have a thickness in a range of 0.2 to 5 μm. Example patterned electrolytic plating layer 212 may have a thickness in a range of 2 to 150 μm.

Figure 2B:
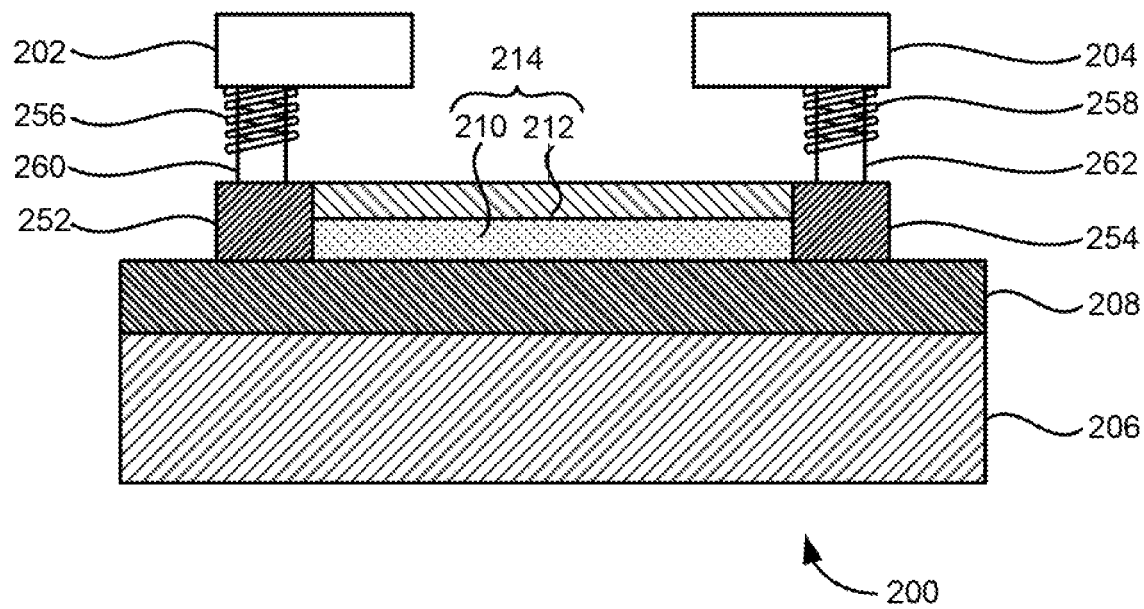
FIG. 2B illustrates the cross-sectional front view of the example electronic device of FIG. 2A, depicting additional features.

FIG. 2B illustrates the cross-sectional front view of example electronic device 200 of FIG. 2A, depicting additional features. For example, similarly named elements of FIG. 2B may be similar in structure and/or function to elements described with respect to FIG. 2A. Example electronic device 200 may include a first contact pad 252 formed on insulating adhesive layer 208. In one example, first contact pad 252 may be connected to a first end of patterned electroconductive layer 214. As shown in FIG. 2B, electronic device 200 may include a second contact pad 254 formed on insulating adhesive layer 208. Example second contact pad 254 may be connected to a second end of patterned electroconductive layer 214. First contact pad 252 may be electrically connected to second contact pad 254 using patterned electroconductive layer 214 that forms a circuit having a defined pattern.

In one example, electronic device 200 may include a first surface co act connector 260 having a first end connected to first circuit board 202 via a first spring 256 and a second end physically engaged with first contact pad 252. Further, electronic device 200 may include a second surface contact connector 262 having a first end connected to second circuit board 204 via a second spring 258 and a second end physically engaged with second contact pad 254. Thus, patterned electroconductive layer 214 may electrically connect first circuit board 202 and second circuit board 204 using first surface contact connector 260 and second surface contact connector 262. Example first surface contact connector 260 and second surface contact connector 262 may be pin headers.

Figure 2C:
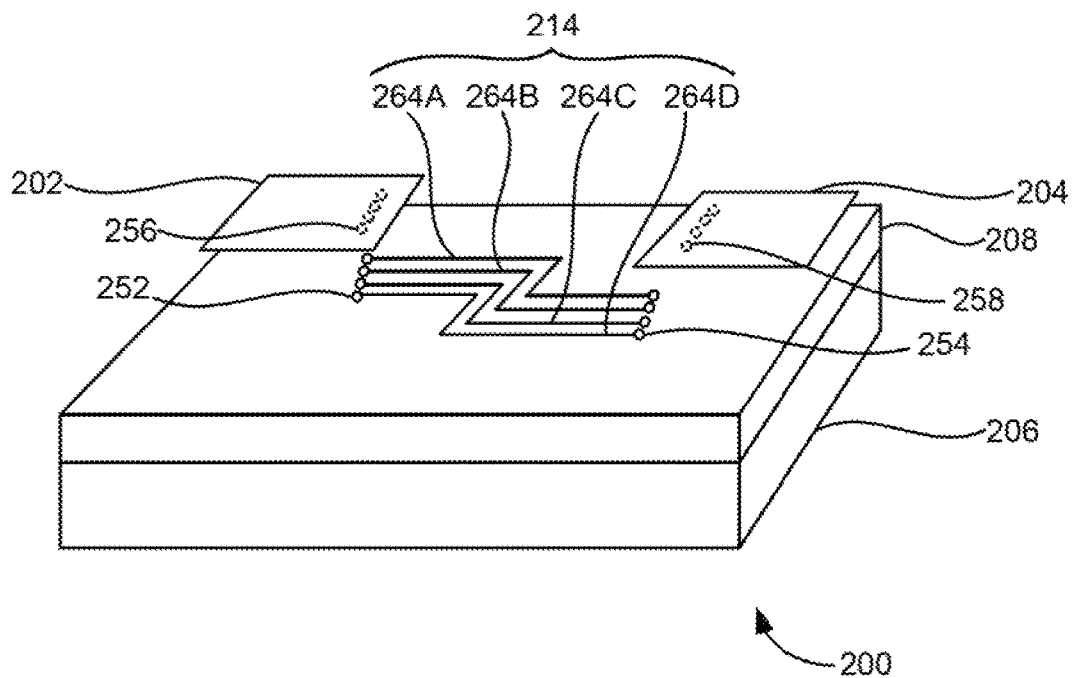
FIG. 2C illustrates a perspective top view of the example electronic device of FIG. 2A, depicting the patterned electroconductive layer to electrically connect the first circuit board and the second circuit board.

FIG. 2C illustrates a perspective top view of example electronic device 200 of FIG. 2A, depicting patterned electroconductive layer 214 to electrically connect first circuit board 202 and second circuit board 204. For example, similarly named elements of FIG. 2C may be similar in structure and/or function to elements described with respect to FIG. 2A. As shown in FIG. 2C, patterned electroconductive layer 214 may include a circuit having a pattern, which may electrically connect first circuit board 202 and second circuit board 204. In one example, the circuit may include multiple traces 264A-264D to electrically connect first circuit board 202 and second circuit board 204.

In one example, each trace may have a pair of contact pads disposed at opposite ends. For example, a pair of contact pads 252 and 254 can be interconnected via a trace 264D of the circuit. Similarly, a pair of surface contact connectors may be used to connect each trace to respective electric contacts of first circuit board 202 and second circuit board 204. For example, surface contact connectors 260 and 262 (e.g., as shown in FIG. 2B) may be used to connect trace 264D to respective electric contacts of first circuit board 202 and second circuit board 204 via springs 256 and 258, respectively.

In one example, first circuit board 202 and second circuit board 204 may be fixedly secured to a top cover of a keyboard housing (e.g., 206) of electronic device 200. Further, patterned electroconductive layer 214 may be formed on an inner surface of a bottom cover of the keyboard housing to electrically connect first circuit board 202 and second circuit board 204. Further, first surface contact connector 260 and second surface contact connector 262 of FIG. 2B may be fixedly secured to first circuit board 202 and second circuit board 204 via springs 256 and 258, respectively.

When the top cover and the bottom cover are assembled, surface contact connectors 260 and 262 (e.g., pin headers) may physically contact respective contact pads 252 and 254 and compress to electrically connect first circuit board 202 and second circuit board 204. In other examples, any other type of surface contact connectors can be used to implement the examples described herein. Further, housing 206 may be a display housing and patterned electroconductive layer 214 described herein may be formed on an inner surface of the display housing to electrically connect circuit boards 202 and 204 of the display housing.

Figure 3:
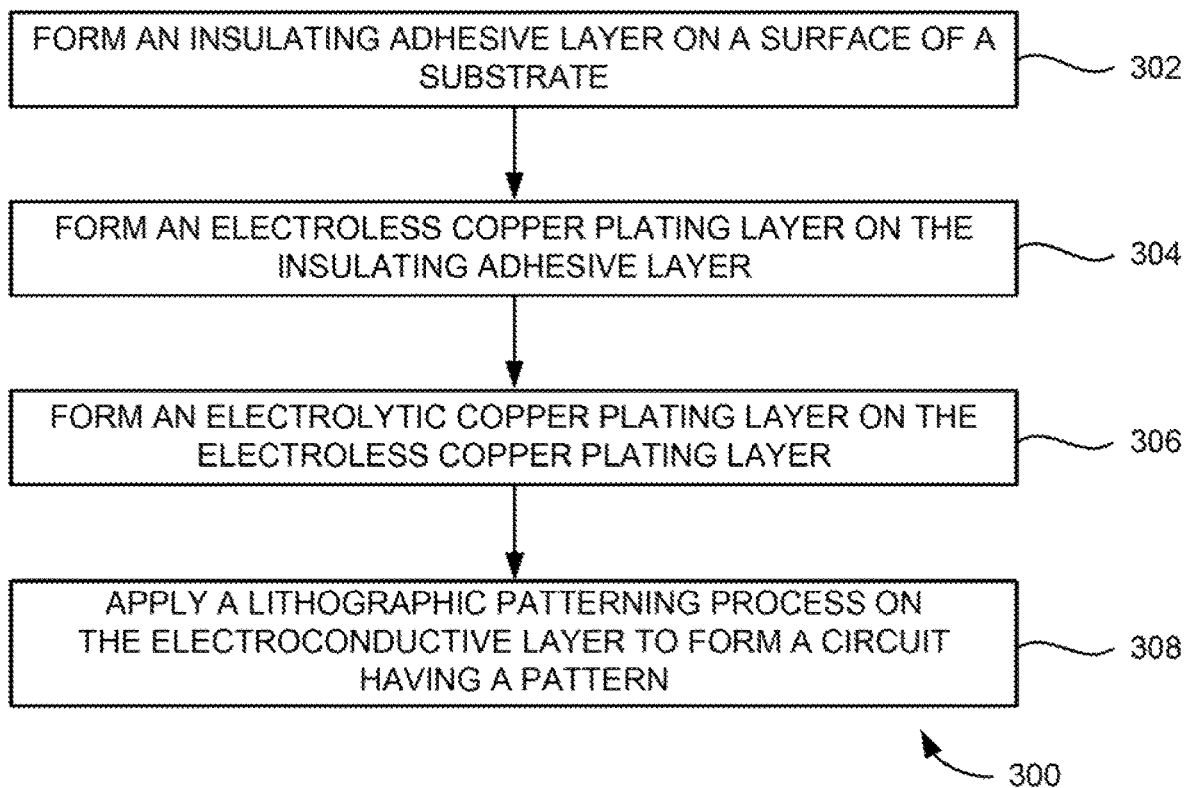
FIG. 3 illustrates an example flowchart for manufacturing a casing of an electronic device.

FIG. 3 illustrates an example flowchart 300 for manufacturing a casing or housing of an electronic device. It should be understood that example flowchart 300 represents generalized illustrations, and that other processes may be added, or existing processes may be removed, modified, or rearranged without departing from the scope and spirit of the present application. Further, example flowchart 300 may not intended to limit the implementation of the present application, but rather example flowchart 300 illustrates functional information to design/fabricate circuits, generate machine-readable instructions, or use a combination of hardware and machine-readable instructions to perform the illustrated processes.

At 302, an insulating adhesive layer may be formed on a surface of a substrate. Further, an electroconductive layer may be formed on the insulating adhesive layer. In one example, forming the electroconductive layer may include forming an electroless copper plating layer on the insulating adhesive layer (e.g., at 304) and forming an electrolytic copper plating layer on the electroless copper plating layer (e.g., at 306).

At 308, a lithographic patterning process may be applied on the electroconductive layer to form a circuit having a pattern. The process of applying the lithographic patterning process is described in FIG. 4.

In one example, a first contact pad may be formed on the insulating adhesive layer. Example first contact pad may be connected to a first end of the circuit. Further, a second contact pad may be formed on the insulating adhesive layer. Example second contact pad may be connected to a second end of the circuit such that the first contact pad and the second contact pad are interconnected via a trace of the circuit.

FIG. 4 illustrates another example flowchart 400 for manufacturing a casing or housing of an electronic device. It should be understood that example flowchart 400 represents generalized illustrations, and that other processes may be added, or existing processes may be removed, modified, or rearranged without departing from the scope and spirit of the present application. Further, example flowchart 400 may not intended to limit the implementation of the present application, but rather example flowchart 400 illustrates functional information to design/fabricate circuits, generate machine-readable instructions, or use a combination of hardware and machine-readable instructions to perform the illustrated processes.

At 402, an insulating adhesive layer with a release film may be applied on a surface of a substrate. Example substrate may include metal, plastic, carbon-fiber composite, or any combination thereof. In one example, the substrate may be pre-formed. For example, preforming the substrate may include forging, thixomolding, die casting, or computer numerical control (CNC) machining the substrate into a desired shape and then cleaning the forged, thixomolded, die casted, or CNC machined metal alloy frame. The cleaning of the metal substrate may include a pre-cleaning process, such as an alkaline cleaning process, degreasing cleaning process, an acidic cleaning process, or any combination thereof.

At 404, the substrate may be treated with an anti-fingerprint coating composition upon applying the insulating adhesive layer with the release film. At 406, the release film may be removed. Thus, the insulating adhesive layer may be formed on the surface of the substrate.

At 408, a plasma treatment may be applied to the insulating adhesive layer. For example, plasma treatment may be performed using oxygen, tetrafluoromethane, or a combination thereof. Further at 408, a subsequent ultraviolet treatment may be applied prior to forming an electroconductive layer on the insulating adhesive layer. For example, ultraviolet treatment may include applying a high voltage of alternating current to radiate ultraviolet light towards the insulating adhesive layer. The plasma treatment and the ultraviolet treatment may be applied on the insulating adhesive layer to form a surface roughness and to improve adhesion between the insulating adhesive layer and the electroconductive layer.

At 410, an electroless copper plating process may be applied on the ultraviolet treated insulating adhesive layer to form an electroless copper plating layer. In an example electroless copper plating process, the insulating adhesive layer may be soft-etched and pickled, and then electrolessly plated with copper using an electroless plating solution. Example electroless plating solution may include components (e.g., with weight percentage) such as copper salt of about 0.2-10%, ethylenediaminetetraacetic acid (EDTA) of about 1-5%, and sodium hydroxide (NaOH) of about 0.1-1%.

At 412, an electrolytic copper plating process may be applied on the electroless copper plating layer to form an electrolytic copper plating layer. Example electrolytic copper plating process may include applying an electrolytic copper plating solution on a surface of the electroless copper plating layer. Example electrolytic copper plating solution may include components (e.g., with weight percentage) such as copper sulfate ($CuSO_4$) of about 0.05-3%, sulfuric acid ($H_2SO_4$) of about 0.03-0.15%, and chlorine (Cl) ion (i.e., from hydrochloric acid (HCl)) of about 30-200 ppm. In one example, the electroless copper plating layer and the electrolytic copper plating layers may form the electroconductive layer.

At 414, a lithographic patterning process may be applied on the electroconductive layer to form a circuit having a defined pattern. Example lithographic patterning process may include
  forming a photoresist layer on a surface of the electroconductive layer,
  pre-baking the photoresist layer to solidify the photoresist layer,
  aligning and exposing the photoresist layer to an infrared radiation, an ultraviolet radiation, or a combination thereof,
  post-baking the photoresist layer to smoothen a rough feature of the photoresist layer,
  developing the photoresist layer to form a patterned photoresist layer,
  etching the electroconductive layer, while using the patterned photoresist layer as a mask, to form the circuit with the pattern, and
  removing the patterned photoresist layer from the surface of the electroconductive layer.

Thus, examples described herein may form a PCB layout (e.g., the patterned electroconductive layer) directly on the housing of an electronic device. Further, examples described herein may can eliminate the cable utilization, thereby enhancing electrical design and mechanical design of the electronic device.

It may be noted that the above-described examples of the present solution are for the purpose of illustration only. Although the solution has been described in conjunction with a specific implementation thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract, and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. An electronic device, comprising:
   a first circuit board;
   a second circuit board;
   a housing to house the first circuit board and the second circuit board;
   an insulating adhesive layer formed on a surface of the housing;
   a patterned electroconductive layer formed on the insulating adhesive layer to electrically connect the first circuit board and the second circuit board, wherein the patterned electroconductive layer comprises:
      a patterned electroless plating layer formed on the insulating adhesive layer; and
      a patterned electrolytic plating layer formed on the patterned electroless plating layer;
   a first contact pad formed on the insulating adhesive layer and connected to a first end of the patterned electroconductive layer;
   a second contact pad formed on the insulating adhesive layer and connected to a second end of the patterned electroconductive layer, wherein the first contact pad is electrically connected to the second contact pad using the patterned electroconductive layer;
   a first surface contact connector having a first end connected to the first circuit board via a first spring and a second end physically engaged with the first contact pad; and
   a second surface contact connector having a first end connected to the second circuit board via a second spring and a second end physically engaged with the second contact pad.

2. The electronic device of claim 1, wherein the insulating adhesive layer comprises polyvinyl acetate, acrylic, phenolics, polycarbonate, polyester, polytetrafluoroethylene (PTFE), polyvinylchloride (PVC), polyetherimide (PEI), polyimide, or any combination thereof.

3. The electronic device of claim 1, wherein the patterned electroless plating layer is a patterned electroless copper plating layer.

4. The electronic device of claim 1, wherein the patterned electrolytic plating layer is a patterned electrolytic copper plating layer.

5. The electronic device of claim 1, wherein the patterned electroless plating layer has a thickness in a range of 0.2 µm to 5 µm.

6. The electronic device of claim 1, wherein the patterned electrolytic plating layer has a thickness in a range of 2 µm to 150 µm.

7. A method for manufacturing a casing of an electronic device, comprising:
   forming an insulating adhesive layer on a surface of a substrate;
   forming an electroconductive layer on the insulating adhesive layer, wherein forming the electroconductive layer comprises:
      forming an electroless copper plating layer on the insulating adhesive layer; and
      forming an electrolytic copper plating layer on the electroless copper plating layer; and
   applying a lithographic patterning process on the electroconductive layer to form a circuit having a pattern, wherein applying the lithographic patterning process on the electroconductive layer comprises:
      forming a photoresist layer on a surface of the electroconductive layer;
      aligning and exposing the photoresist layer to at least one of an infrared radiation and an ultraviolet radiation;
      developing the photoresist layer to form a patterned photoresist layer;
      etching the electroconductive layer, while using the patterned photoresist layer as a mask, to form the circuit with the pattern; and
      removing the patterned photoresist layer from the surface of the electroconductive layer.

8. The method of claim 7,
   wherein the insulating adhesive layer is a material selected from the group consisting of polyvinyl acetate, polycarbonate, polytetrafluoroethylene (PTFE), polyvinylchloride (PVC), polyetherimide (PEI), polyimide, and a combination thereof.

9. A method for manufacturing a casing of an electronic device comprising:
   forming an insulating adhesive layer on a surface of a substrate;
   forming an electroconductive layer on the insulating adhesive layer, wherein forming the electroconductive layer comprises:
      forming an electroless copper plating layer on the insulating adhesive layer; and
      forming an electrolytic copper plating layer on the electroless copper plating layer; and
   applying a lithographic patterning process on the electroconductive layer to form a circuit having a pattern;
   wherein forming the insulating adhesive layer on the surface of the substrate comprises:
      applying the insulating adhesive layer with a release film on the surface of the substrate;
      treating the substrate with an anti-fingerprint coating composition upon applying the insulating adhesive layer with the release film; and
      removing the release film.

10. A method for manufacturing a casing of an electronic device, comprising:
   forming an insulating adhesive layer on a surface of a substrate;
   forming an electroconductive layer on the insulating adhesive layer, wherein forming the electroconductive layer comprises:
      forming an electroless copper plating layer on the insulating adhesive layer; and
      forming an electrolytic copper plating layer on the electroless copper plating layer;
   applying a lithographic patterning process on the electroconductive layer to form a circuit having a pattern; and treating the insulating adhesive layer by applying a plasma treatment and a subsequent ultraviolet treatment prior to forming the electroconductive layer on the insulating adhesive layer.

11. The method of claim 10, further comprising:
forming a first contact pad on the insulating adhesive layer, wherein the first contact pad is connected to a first end of the circuit; and
forming a second contact pad on the insulating adhesive layer, wherein the second contact pad is connected to a second end of the circuit such that the first contact pad and the second contact pad are interconnected via a trace of the circuit.

\* \* \* \* \*